(12) United States Patent
Tran et al.

(10) Patent No.: US 6,925,003 B2
(45) Date of Patent: Aug. 2, 2005

(54) MAGNETIC MEMORY CELL STRUCTURE

(75) Inventors: Lung Tran, Saratoga, CA (US); Thomas C. Anthony, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 91 days.

(21) Appl. No.: 10/658,158

(22) Filed: Sep. 8, 2003

(65) Prior Publication Data

US 2005/0052905 A1 Mar. 10, 2005

(51) Int. Cl.[7] .............................................. G11C 11/00
(52) U.S. Cl. ....................................... 365/173; 365/171
(58) Field of Search ................................. 365/173, 171, 365/157, 158

(56) References Cited

U.S. PATENT DOCUMENTS 6,404,674 B1   6/2002  Anthony et al.
6,611,453 B2 * 8/2003  Ning ........................... 365/171
6,807,086 B2 * 10/2004 Kajiyama

* cited by examiner

Primary Examiner—Tan T. Nguyen
(74) Attorney, Agent, or Firm—Brian R. Short

(57) ABSTRACT

The invention includes a magnetic memory cell. The magnetic memory cell includes a reference layer having a preset magnetization. A barrier layer is formed adjacent to the reference layer. A sense layer is formed adjacent to the barrier layer. A first conductive write line is electrically connected to the reference layer. The magnetic memory cell further includes a second conductive write line having a gap, the gap being filled by at least a portion of the sense layer. A write current conducting through the second conductive write line is at least partially conducted through the portion of the sense layer, the write current increasing a temperature of the sense layer.

25 Claims, 12 Drawing Sheets

MAGNETIC MEMORY CELL STRUCTURE

FIELD OF THE INVENTION

The invention relates generally to electronic memory. More particularly, the invention relates to a magnetic memory cell structure.

BACKGROUND OF THE INVENTION

Non-volatile memory is memory that retains its content (data) even when power connected to the memory is turned off. Magnetic random access memory (MRAM) is a type of non-volatile memory. MRAM includes storing a logical state, or bit, by setting magnetization orientations of MRAM cells within the MRAM. The magnetiztion orientations remain even when power to the MRAM cells is turned off.

FIG. 1 shows an MRAM cell 100. The MRAM memory cell 100 includes a soft magnetic region 120, a dielectric region 130 and a hard magnetic region 110. The orientation of magnetization within the soft magnetic region 120 is non-fixed, and can assume two stable orientations as shown by the arrow M1. The hard magnetic region 110 (also referred to as a pinned magnetic region) has a fixed magnetic orientation as depicted by the arrow M2. The dielectric region 130 generally provides insulation between the soft magnetic region 120 and the hard magnetic region 110.

The MRAM memory cell generally is located proximate to a crossing point of a word line (WL) and a bit line (BL). The word line and the bit line can be used for setting the magnetic state of the memory cell, or for sensing an existing magnetic state of the memory cell. FIG. 1 also includes a proximate word line that can also be used to set the magnetic state of the MRAM memory cell 100. A magnetic field as depicted by the arrow 150 can be induced by a current I flowing through the proximate word line. The induced magnetic field can set the magnetic state of the MRAM memory cell 100.

As previously stated, the orientation of magnetization of the soft magnetic region 120 can assume two stable orientations. These two orientations, which are either parallel or anti-parallel to the magnetic orientation of the hard magnetic region 110, determine the logical state of the MRAM memory cell 100.

The magnetic orientations of the MRAM memory cells can be set (written to) by controlling electrical currents flowing through the word lines and the bit lines, and therefore, by the corresponding magnetic fields induced by the electrical currents. Because the word line and the bit line operate in combination to switch the orientation of magnetization of the selected memory cell (that is, to write to the memory cell), the word line and the bit line can be collectively referred to as write lines. Additionally, the write lines can also be used to read the logic value stored in the memory cells. The electrical currents applied to the bit line and the word line set the orientation of the magnetization of the soft magnetic layer depending upon the directions of the currents flowing through the bit line and the word line, and therefore, the directions of the induced magnetic fields created by the currents flowing through the bit line and the word line.

The MRAM memory cells are read by sensing a resistance across the MRAM memory cells. The resistance is sensed through the word lines and the bit lines. Generally, the logical state (for example, a "0" or a "1") of a magnetic memory cell depends on the relative orientations of magnetization in the data layer and the reference layer. For example, in a tunneling magneto-resistance memory cell (a tunnel junction memory cell), when an electrical potential bias is applied across the data layer and the reference layer, electrons migrate between the data layer and the reference layer through the intermediate layer (a thin dielectric layer typically called the tunnel barrier layer). The phenomenon of electron migration through the barrier layer may be referred to as quantum mechanical tunneling or spin tunneling. The logic state can be determined by measuring the resistance of the memory cell. For example, the magnetic memory cell is in a state of low resistance if the overall orientation of the magnetization in its data storage layer is parallel to the pinned orientation of magnetization of the reference layer. Conversely, the tunneling junction memory cell is in a high resistance if the overall orientation of magnetization in its data storage layer is anti-parallel to the pinned orientation of magnetization of the reference layer. As mentioned, the logic state of a bit stored in a magnetic memory cell is written by applying external magnetic fields that alter the overall orientation of magnetization of the data layer. The external magnetic fields may be referred to as switching fields that switch the magnetic memory cells between high and low resistance states.

FIG. 2 shows an array 210 of MRAM memory cells. The logical states of each of the MRAM memory cells can be magnetically set by externally applied magnetic fields through bit lines (BL) and word lines (WL). Generally, the bit line and word line selections are made through a row decoder 220 and a column decoder 230. The logical states of the memory cells are determined by a sense amplifier 240.

The array 210 of MRAM memory cells can suffer from half-select errors. Memory cells are selected by selecting a particular bit line (BL), and selecting a particular word line (WL). Half-select error occur when a memory cell associated with a selected bit line and a non-selected word line change states, or when a memory cell associated with a non-selected bit line and a selected word line change states. Clearly, half-select errors degrade the performance of MRAM memory.

It is desirable to minimize half-select errors of MRAM memory cells. Additionally, it is desirable that MRAM memory be dense, and dissipate low power.

SUMMARY OF THE INVENTION

The invention includes an apparatus and method for configuring magnetic memory cell memory cells. The apparatus and method provide for reduced half-select errors. Additionally, the magnetic junction memory is dense, and dissipates low power.

An embodiment of the invention includes a magnetic memory cell. The magnetic memory cell includes a reference layer having a preset magnetization. A barrier layer is formed adjacent to the reference layer. A sense layer is formed adjacent to the barrier layer. A first conductive write line is electrically connected to the reference layer. The magnetic memory cell further includes a second conductive write line having a gap, the gap being filled by at least a portion of the sense layer. A write current conducting through the second conductive write line is at least partially conducted through the portion of the sense layer, the write current increasing a temperature of the sense layer.

Another embodiment of the invention includes a group of magnetic memory cells, the group of magnetic memory cells forming a layer over a substrate. Each magnetic memory cell includes a reference layer having a preset magnetization. A barrier layer is formed adjacent to the reference layer. A sense layer is formed adjacent to the barrier layer. A first conductive write line is electrically connected to the reference layer. A second conductive write line includes a gap, the gap being filled by at least a portion of the sense layer. The group of magnetic memory cells further includes the second conductive write line being electrically connected to the magnetic memory cells, the common conductive write line providing a conductive path for a write current through portions of the sense layers of each of the magnetic memory cells of the group.

Other aspects and advantages of the present invention will become apparent from the following detailed description, taken in conjunction with the accompanying drawings, illustrating by way of example the principles of the invention.

DETAILED DESCRIPTION

Figure 1:
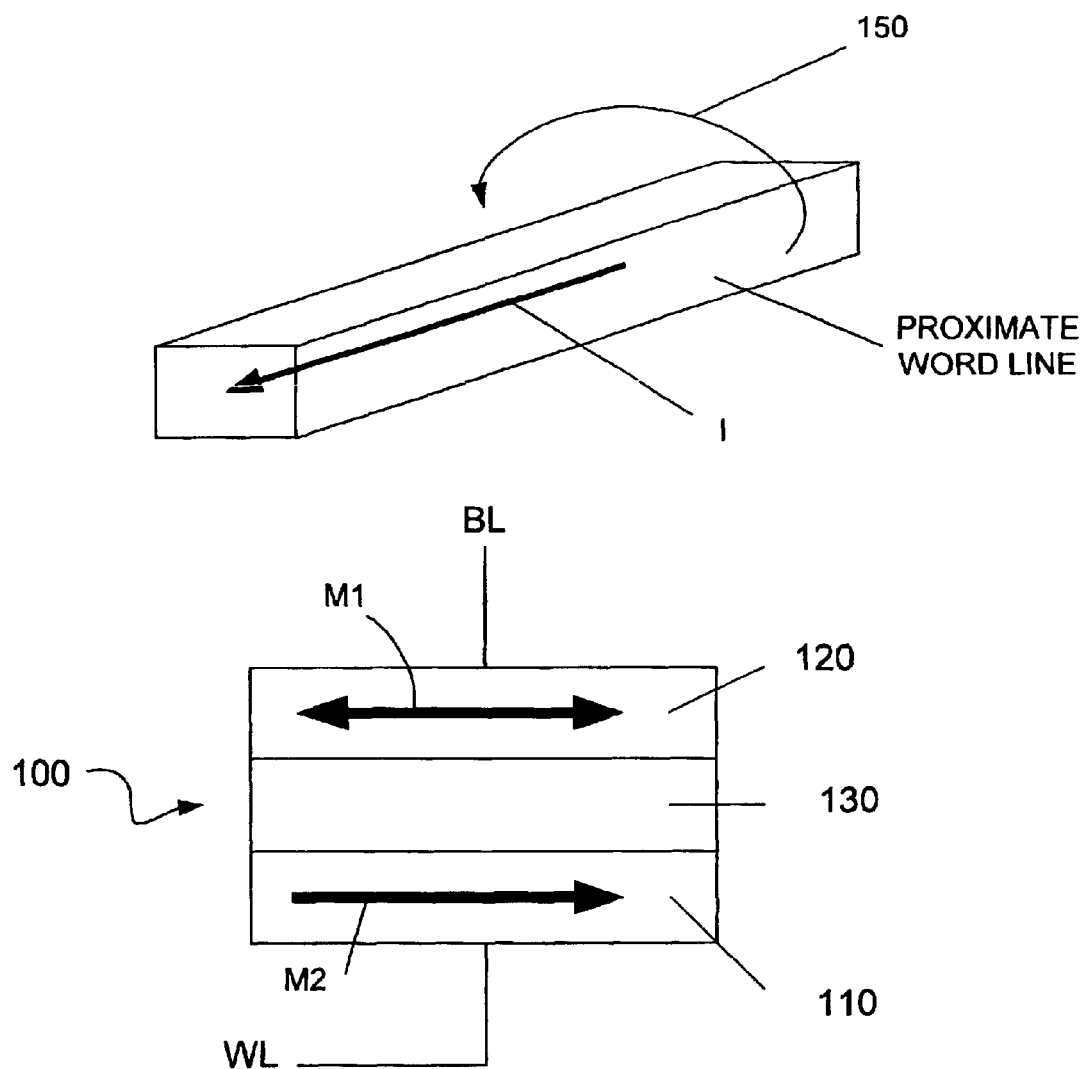
FIG. 1 shows a prior art MRAM memory cell.
Figure 2:
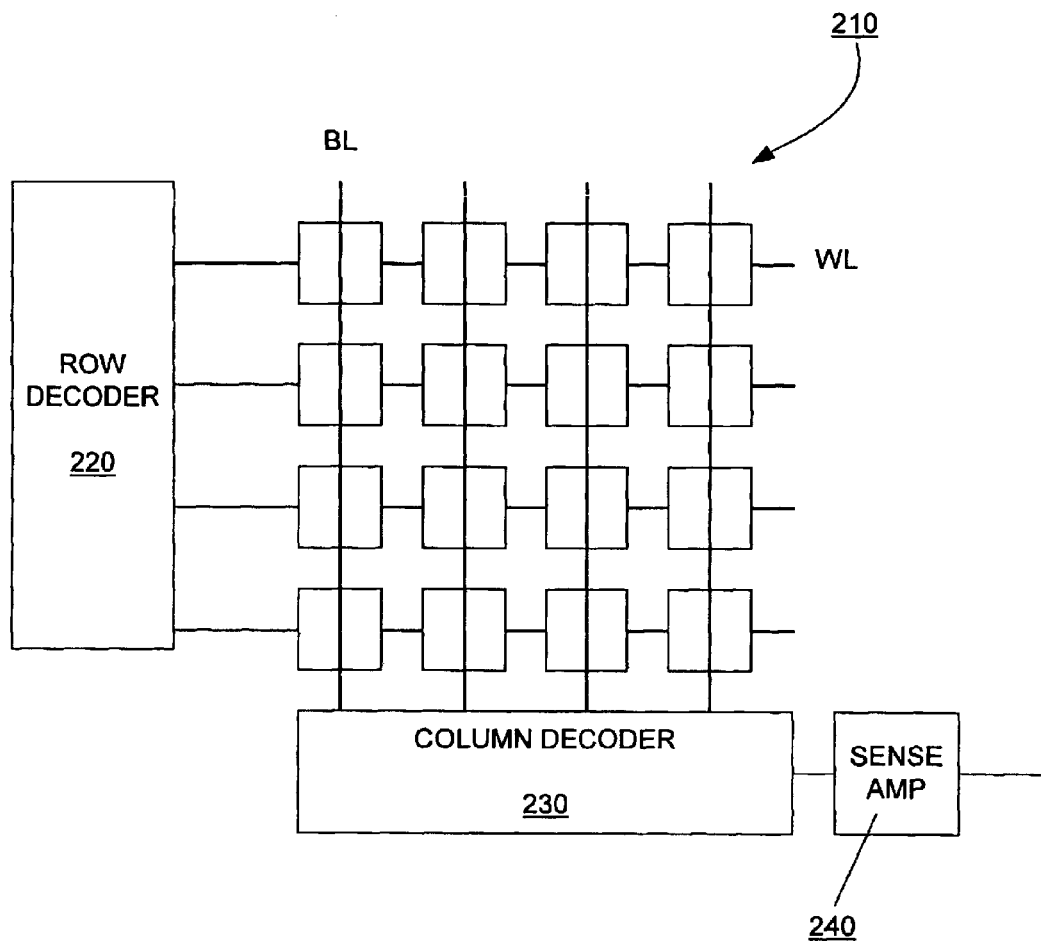
FIG. 2 shows an array of MRAM memory cells.

As shown in the drawings for purposes of illustration, the invention is embodied in an apparatus and method for configuring magnetic memory cells. The apparatus and method provide for reduced half-select errors. Additionally, the magnetic junction memory is dense, and dissipates low power.

Figure 3:
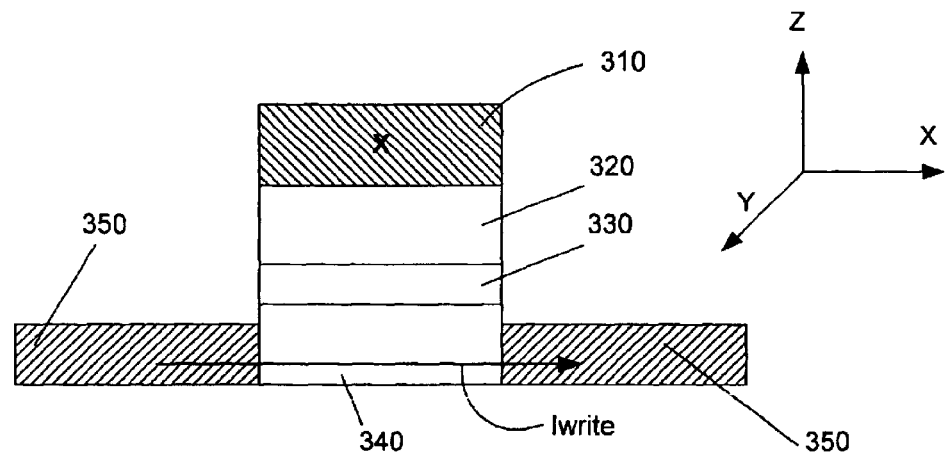
FIG. 3 shows magnetic memory cell according to an embodiment of the invention.

FIG. 3 shows a magnetic memory cell according to an embodiment of the invention. The magnetic memory cell includes a sense (data) layer 340, a barrier layer 330 and a reference layer 320. A first conductive line 310 is electrically connected to the reference layer 320, and a second conductive line 350 is electrically connected to the sense layer 340.

The second conductive line 350 includes a gap in which at least a portion of the sense layer 340 is positioned. Current (Iwrite) conducted through the second conductive line 350 flows through the sense layer 340. The current (Iwrite) can serve dual purposes. A first purpose includes aiding in setting the orientation of the magnetization of the sense layer 340. That is, a first purpose of the current (Iwrite) is to aid in writing to the sense layer 340 of the magnetic memory cell. A second purpose can include heating the sense layer 340 of the magnetic memory cell. A resistance of the sense layer 340 dissipates power when current flows through the sense layer 340. The dissipated power causes the sense layer 340 to heat. As will be described in detail later, heating the sense layer 340 can reduce the magnetic field intensity required to write to the sense layer 340. Selective heating of magnetic memory cells selectively reduces the magnetic field intensity required to write to the selected memory cell. This feature can be used to reduce half select errors.

The reference layer 320 can include a single layer of material or multiple layers of material. For example, the reference layer 320 can include one or more ferromagnetic materials. Such materials can include nickel iron, nickel iron cobalt, cobalt iron, or other magnetic alloys of nickel iron and cobalt. The reference layer 320 can also include an anti-ferromagnetic material, such as, platinum manganese or iridium manganese. The barrier layer 330 can include aluminum oxide, aluminum nitride, silicon oxide, silicon nitride, and/or other insulating materials. The sense layer 340 can include one or more ferromagnetic materials. Such materials can include nickel iron, nickel iron cobalt, cobalt iron, or other magnetic alloys of nickel iron and cobalt.

Figure 4:
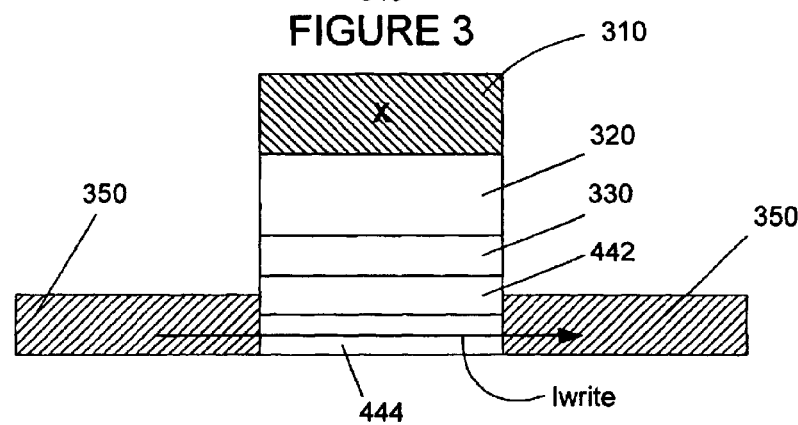
FIG. 4 shows another magnetic memory cell according to an embodiment of the invention.

FIG. 4 shows another magnetic memory cell according to an embodiment of the invention. The sense layer of this embodiment includes a ferromagnetic layer 442 and an anti-ferromagnetic layer 444. Generally, the anti-ferromagnetic layer 444 determines a temperature dependence of the magnetic memory cell. That is, the anti-ferromagnetic layer 444 determines the variation in magnetic coercivity of the sense layer with variations in temperature. This embodiment provides the feature that the temperature dependence of the magnetic coercivity can be controlled by the temperature dependence of the anti-ferromagnetic layer, rather than the temperature dependence of the ferromagnetic layer. This enables more flexibility in generating the desired temperature dependence of the sense layer magnetic coercivity.

FIG. 3 and FIG. 4 show portions of the sense layers physically positioned within a gap of the second conductive line. Another embodiment includes a portion of the reference layer 320 being physically positioned within the gap. Current passing through the portion of the reference layer 320 can also heat the magnetic memory cell, providing a decrease in the magnetic filed intensity required to write to the magnetic memory cell.

Figure 5:
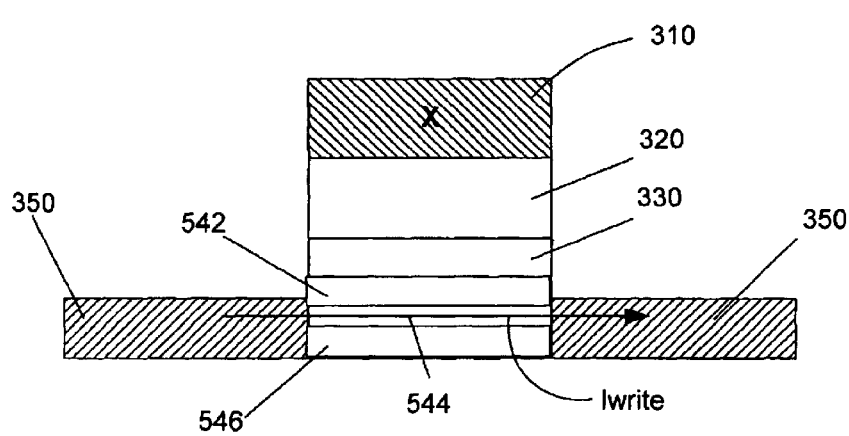
FIG. 5 shows another magnetic memory cell according to an embodiment of the invention.

FIG. 5 shows another magnetic memory cell according to an embodiment of the invention. The sense layer of this embodiment includes a first sub-sense layer 542 and a second sub-sense layer 546. the first sub-sense layer 542 and the second sub-sense layer 546 are separated by a spacer layer 544. The spacer layer 544 prevents direct ferromagnetic exchange between the two sub-sense layers 542, 546, or mediates ferromagnetic exchange between the two sub-sense layers 542, 546. Generally, the magnetic orientation of the first sub-sense layer 542 determines the magnetic (logical) state of the memory cell. Generally, the direction of magnetization of the first sub-sense layer 542 is opposite of the direction of the magnetization of the second sub-sense layer 546. Generally, the directions of the magnetization of the first sub-sense layer 542 and the second sub-sense layer 546 are orthogonal to the directions of current flow (Iwrite) through the conductor 350.

The magnetic memory cell of FIG. 5 can be configured so that the spacer layer 544 facilitates heating of the sub-sense layers 542, 546. For this configuration, the spacer layer 544 can be formed from insulators such as $Al_2O_3$ or AlN, or from highly resistive materials such as Ta or TaN. An insulating or highly resistive spacer layer 544 confines Iwrite to flow in the sub-spacer layers 542, 546.

Alternatively, the magnetic memory cell of FIG. 5 can be configured so that the spacer layer 544 does not facilitate heating the sub-sense layers 542, 546, but primarily provides a conductive path for current to aid in writing (setting the magnetic orientations) to the sub-sense layers 542, 546. For this configuration, the spacer layer 544 can be formed from Ru or Cu.

The sub-sense layers 542, 546 can each include one or more ferromagnetic materials. Such materials can include nickel iron, nickel iron cobalt, cobalt iron, or other magnetic alloys of nickel iron and cobalt. Other ferromagnetic materials include amorphous alloys such as CoZrNb or CoFeB.

Figure 6:
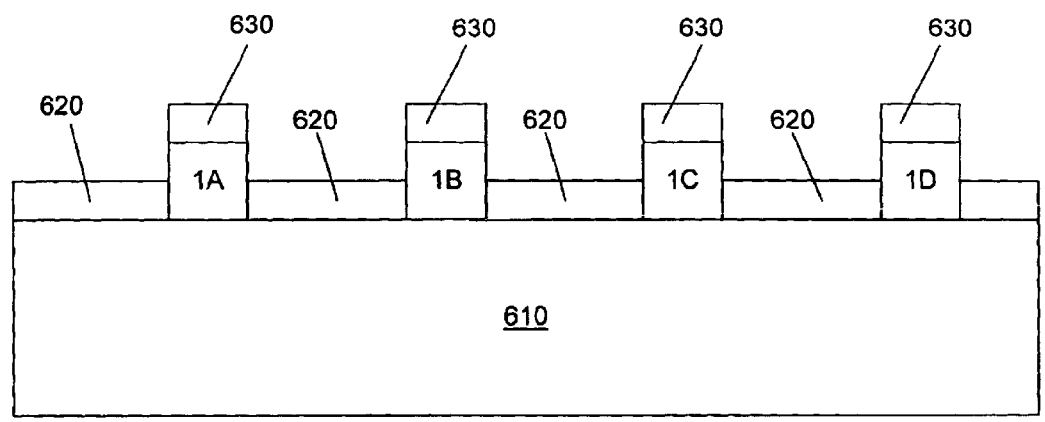
FIG. 6 shows a group of magnetic memory cells forming a layer over a substrate.

FIG. 6 shows a group of magnetic memory cells forming a layer over a substrate. This first group includes magnetic memory cells 1A, 1B, 1C, 1D. The group of magnetic memory cells include a common second conductor 620. When selected, the common second conductor causes current to be conducted through the sense layers of all the magnetic memory cells 1A, 1B, 1C, 1D of the group. Magnetic memory cells 1A, 1B, 1C, 1D within the group can be individually selected by first conductive lines 630. Generally (but not always), selection of the common second conductor 620 causes the sense layers of the magnetic memory cells 1A, 1B, 1C, 1D to heat, which allows for the magnetic memory cells 1A, 1B, 1C, 1D to be written to more easily. Additionally, current conducted through the sense layers of the magnetic memory cells 1A, 1B, 1C, 1D can also aid in writing to the sense layers of the magnetic memory cells 1A, 1B, 1C, 1D. This embodiment can include groups of any number of magnetic memory cells.

The magnetic memory cells of FIG. 6 can include the magnetic memory cells described in FIG. 3, FIG. 4 or FIG. 5.

Figure 7:
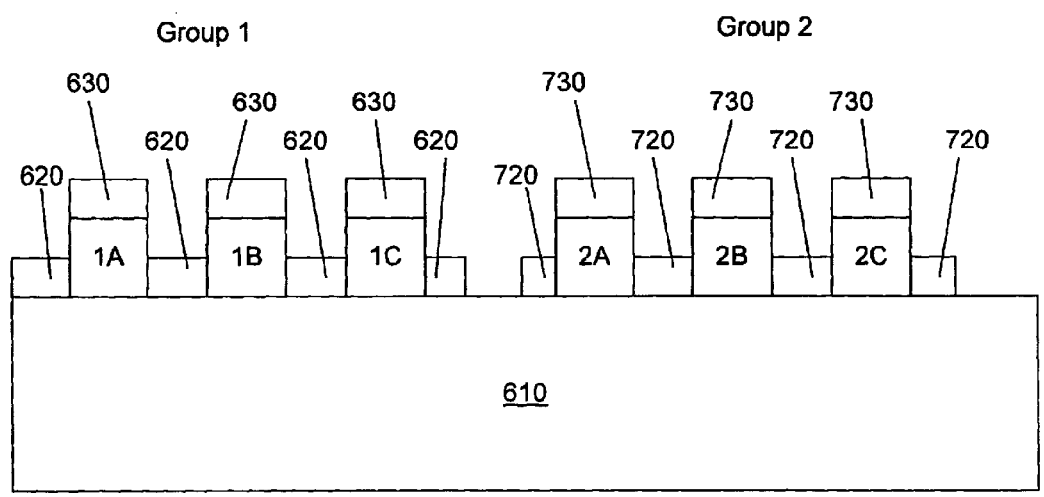
FIG. 7 shows multiple groups of magnetic memory cells forming a layer over a substrate.

FIG. 7 shows a first group of magnetic memory cells 1A, 1B, 1C and a second group of magnetic memory cells 2A, 2B, 2C. Generally, only a single group of memory cells is selected at a time. The second group of magnetic memory cells 2A, 2B, 2C also includes a common second conductor 720. Generally (but not always), selection of the common second conductor 720 causes the sense layers of the magnetic memory cells 2A, 2B, 2C to heat, which allows for the magnetic memory cells 2A, 2B, 2C to be written to more easily. Additionally, current conducted through the magnetic memory cells 2A, 2B, 2C can also aid in writing to the sense layers of the magnetic memory cells 2A, 2B, 2C.

This embodiment can include more than just two groups of memory cells. Each of the groups can include any number of magnetic memory cells. The magnetic memory cells of FIG. 7 can include the magnetic memory cells described in FIG. 3, FIG. 4 or FIG. 5.

Figure 8:
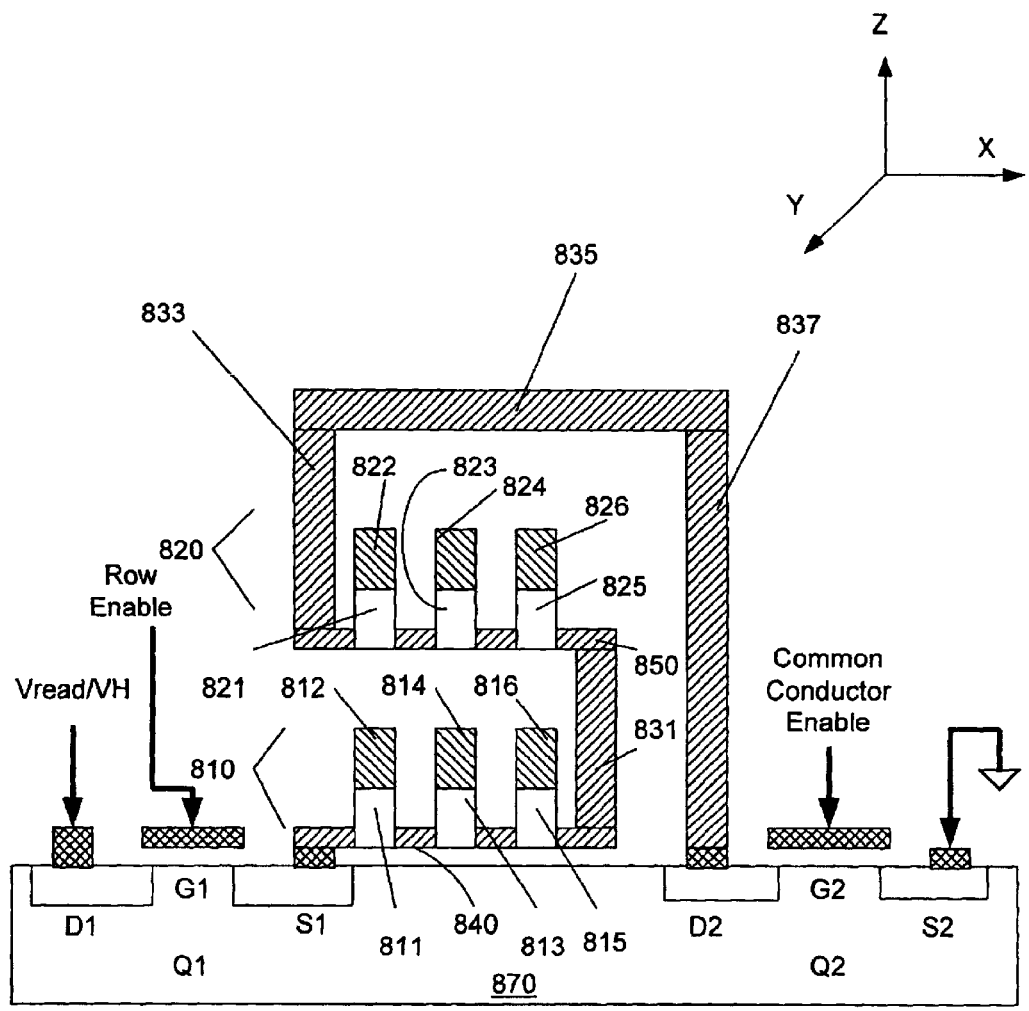
FIG. 8 shows a stacked memory structure according to an embodiment of the invention.

FIG. 8 shows a stacked magnetic memory structure according to an embodiment of the invention. As will be described, this embodiment includes two layers of magnetic memory cells. However, the invention can include any number of layers of stacked memory cells.

The magnetic memory cells generally include magnetic memory cells as shown in FIGS. 3, 4, 5.

A first layer 810 is formed adjacent to a substrate 870. The first layer 810 includes a first plurality of magnetic memory cells 811, 813, 815. Each of the first plurality of magnetic memory cells 811, 813, 815 is electrically connected to a first common conductor 840. Each of the first plurality of magnetic memory cells is also electrically connected to corresponding first select conductive lines 812, 814, 816. The first select conductive lines 812, 814, 816 can be column select conductive lines.

Writing to a particular magnetic tunnel junction generally requires current to be conducted through a corresponding first select conductive line and a corresponding common conductor. For example, writing to a first magnetic tunnel junction 811 generally requires current to be conducted through a first select conductive line 812 and the first common conductor 840. The current conducted through the first conductive line 812 generates a magnetic field Hx having first orientation with respect to the magnetic tunnel junction and the current conducted through the common conductor 840 generates a magnetic field Hy having a second orientation with respect to the magnetic tunnel junction. The current conducted through the common conductor 840 may also result in Joule heating of the magnetic tunnel junction 811 (and tunnel junctions 813, 815, 821, 823, 825).

Figure 9A:
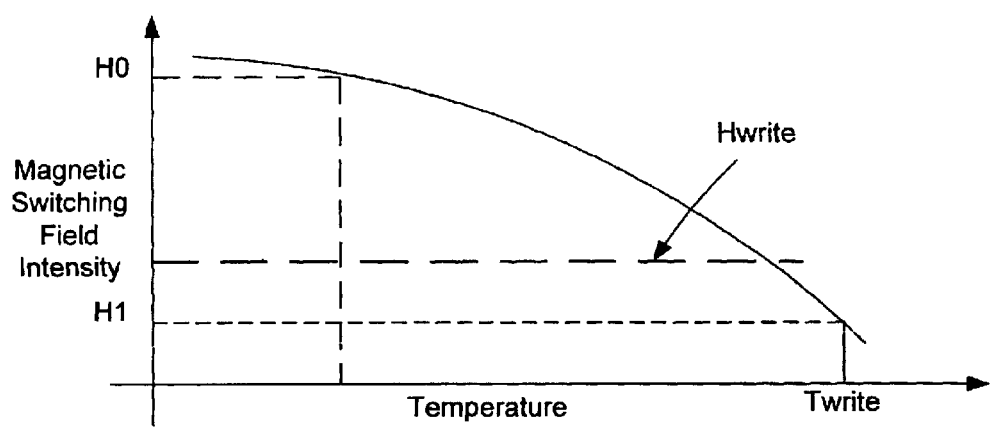
FIG. 9A is a plot showing a temperature dependence of the magnetic coercivity of a magnetic memory cell.

In a first embodiment, magnetic memory cell 811 is selected for writing by a combination of magnetic field Hx produced by current in conductive line 812 and heat provided by current flowing through common conductor 840 and the sense layer of magnetic memory cell 812. The increased temperature of the sense layer reduces its coercivity to a point that the field generated by current in conductive line 812 is sufficient to switch the magnetic state of the memory cell. An example of the temperature dependence of the magnetic coercivity of a magnetic memory cell is shown in FIG. 9A. A memory cell that is heated has a switching field designated as H1. For example, if current of conductor 840 heats memory cell 811 to Twrite, then the applied field Hwrite is sufficient to switch heated memory element 811, but is not great enough to switch unheated memory cells that share the conductive line 812.

Figure 9B:
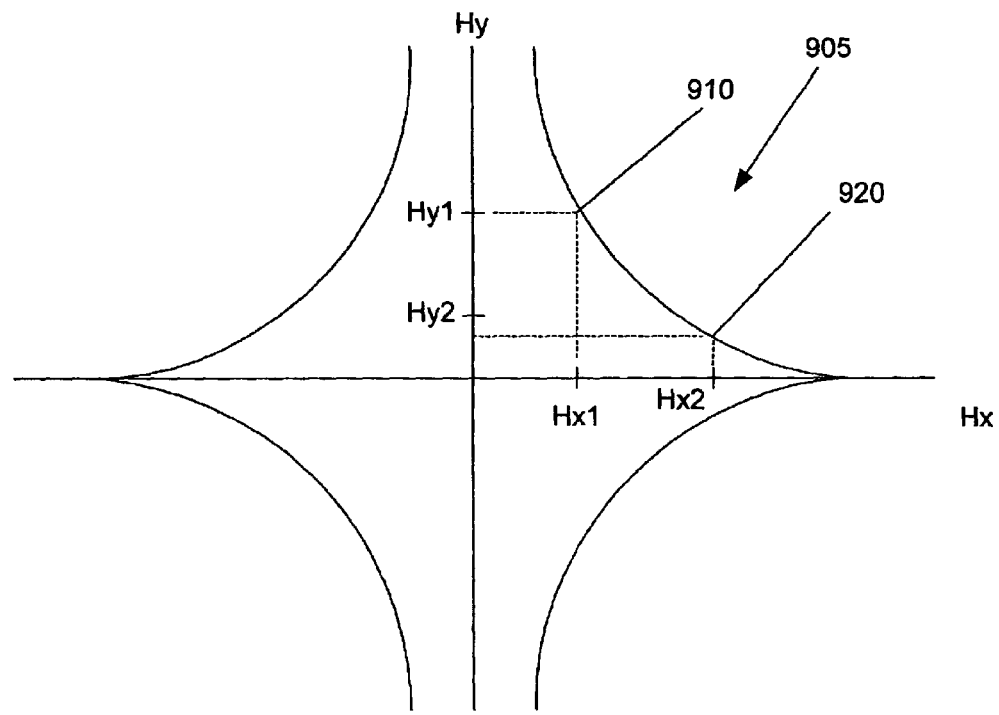
FIG. 9B is a plot showing an intensity of externally applied magnetic fields (Hx, Hy) required to cause an MRAM memory cell to change states.

In a second embodiment, the primary function of current flowing through common conductor 840 is to provide a magnetic field Hy to the sense layer of the magnetic memory cell 811. In this embodiment, the magnetic memory cell 811 is selected for writing by a combination of magnetic field Hx from current flowing through conductive line 812, and the magnetic field Hy resulting from current flowing through common conductor 840 and the sense layer of the memory cell 811. The combination of the Hx and Hy fields provides a sufficient magnetic field to switch the magnetic state of the memory cell, whereas the Hx or Hy fields alone cannot switch the state of the memory cell. The dependence of the switching field on Hx and Hy fields is shown in FIG. 9b.

A third embodiment includes current in the common conductor 840 providing both magnetic field Hx and Joule heating to the sense layer of the memory cell 811. In this embodiment, writing of the memory cell occurs due to the combination of the magnetic field Hx resulting from current flowing in conductive line 812, the magnetic field Hy resulting from current flowing through the common conductor 840, and an increase in the temperature of the memory cell 811 due to current flowing through the sense layer.

Reading from a magnetic memory cell requires an electrical connection between each of the two terminals of the magnetic memory cells. Reading a magnetic memory cell requires sensing a resistance of the magnetic memory cell.

As shown in FIG. 8, a second layer 820 of magnetic memory cells is formed over the first layer 810 of magnetic memory cells. The second layer 820 includes a second plurality of magnetic memory cells 821, 823, 825. The magnetic memory structure of FIG. 8 can further include a second common conductor 850 formed adjacent to the second plurality of magnetic memory cells 821, 823, 825.

The substrate 870 can include a first select transistor Q1, and a second select transistor Q2. When both the first select transistor Q1 and the second select transistor Q2 are turned on, current is conducted through the first common conductor 840 and the second common conductor 850. Generally, the first select transistor Q1 and the second select transistor Q2 are both selected when writing to at least one of the magnetic memory cells 811, 813, 815 of the first layer 810, or of the magnetic memory cells 821, 823, 825 of the second layer 820. The first common conductor 840 and the second common conductor 850 only need to be turned on when writing to a magnetic memory cell.

An embodiment includes the second select transistor Q2 controlling current flow through the first and second common conductors 840, 850. A Common Conductor Enable control is connected to the gate (G2) of the second select transistor Q2, and turns the second select transistor Q2 on when the common conductors 840, 850 are to draw current. The source (S2) of the second select transistor Q2 is connected to ground, and the drain (D2) of the second select transistor Q2 is connected to the second common conductor 850 through conductive lines.

An embodiment includes the first select transistor Q1 providing row selection and common conductor control. A Row Enable control is connected to the gate (G1) of the first select transistor Q1. A Vread sense or a VH (voltage for the common conductors) is connected to the drain (D1) of the first select transistor (Q1). The source (S1) of the first select transistor Q1 is connected to the first common conductor 840. A circuit schematic will be provided later to provide additional clarity of the electrical connection of the stacked magnetic memory cell structure.

Reading of at least one of the magnetic memory cells 811, 813, 815 of the first layer 810, or of the magnetic memory cells 821, 823, 825 of the second layer 820 only requires the first select transistor Q1 to be selected. The selected transistor can be used to sense a resistive state of a magnetic memory cell located between one of the conductive select lines 812, 814, 816, 822, 824, 826 and the selected transistor. As previously described, the resistive state of each magnetic memory cell determines the logical state of the magnetic memory cell.

Conductive lines 831, 833, 835, 837 provide electrical connections between the first common conductor 840, the second common conductor 850 and the select transistors Q1, Q2.

The substrate 870 can include any standard substrate material such as silicon.

The conductive lines 812, 814, 816, 822, 824, 826, 831, 833, 835, 837, 840, 850 can include any generally accepted conductive material such as aluminum, copper or gold.

FIG. 9B shows the magnetic field intensity required to "flip" or change the magnetic orientation of the soft magnetic region of the magnetic memory cell consistent with the previously described second embodiment. For example, a first quadrant 905 of the plot of FIG. 9 shows the required Hx magnetic field to cause the MRAM memory cell to change magnetic states for various values of applied Hy magnetic field. A first switch point 910 suggests a first level Hx1 of required Hx magnetic field intensity to change the magnetic state of the memory cell for a first level Hy1 of Hy magnetic filed intensity. A second switch point 920 suggests a second level Hx2 of required Hx magnetic field intensity to change the magnetic state of the memory cell for a second level Hy2 of Hy magnetic filed intensity. The required Hx2 magnetic field intensity of the second switch point 920 is greater than the required Hx1 magnetic field intensity of the first switch point 910.

Figure 10:
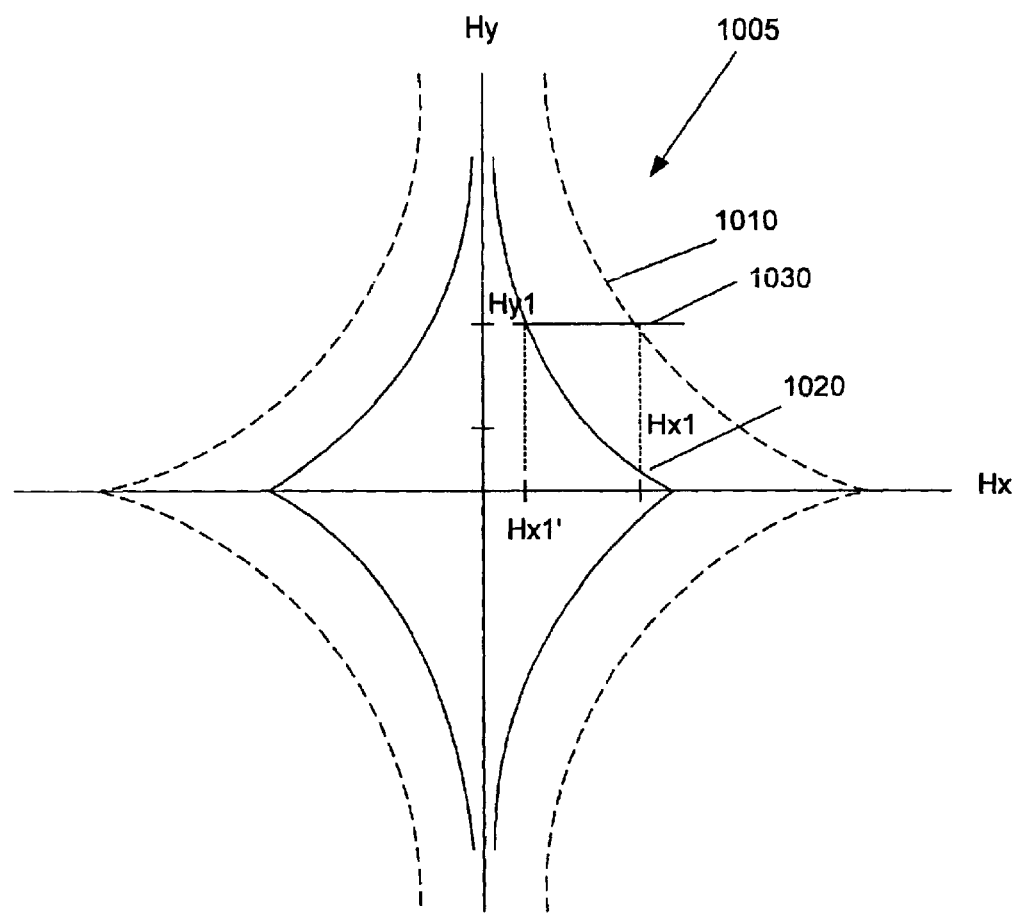
FIG. 10 is a plot showing an intensity of externally applied magnetic fields required to cause an MRAM memory cell to change states, for two different MRAM cell temperatures.

FIG. 10 is a plot showing an intensity of externally applied magnetic fields required to cause an MRAM memory cell to change states for two different MRAM cell temperatures. A first curve 1010 represents the magnetic field intensity required to change or flip the magnetic orientation of a magnetic memory cell for a first temperature. A second curve 1020 represents the magnetic field intensity required to change of flip the magnetic orientation of a magnetic memory cell for a second temperature.

The effect of temperature on the ability to change to the state of the magnetic memory cell can be observed by observing the required Hx magnetic field required to change the state of the magnetic memory cells for a fixed Hy magnetic field as depicted by line 1030. As depicted by line 1020, for a fixed Hy magnetic field of Hy1, the required Hx magnetic field intensity is Hx1 for the first temperature, and the required Hx magnetic field intensity is Hx' for the second temperature. Hx1' is less than Hx1 when the second temperature is greater than the first temperature.

The first temperature is generally less than the second temperature. Therefore, the magnetic field intensity required to change or flip the state of the magnetic memory cell is less for a greater temperature. This suggests that activating a common conductor proximate to a magnetic memory cell reduces the amount of write current required to change or flip the magnetic orientation of the magnetic memory cell.

For the magnetic memory cells of FIG. 8, the magnetic memory cells that include a common conductor that is "turned on" require a smaller magnitude of write current to change or flip the magnetic state of the magnetic memory cells. Magnetic memory cells that include a common conductor that is not "turned on", require a greater magnitude of write current to change of flip the magnetic state of the magnetic memory cells. Therefore, non-selected magnetic memory cells that include non-selected common conductors are less likely to suffer from half-select errors.

The foregoing writing procedure describes writing to a single magnetic memory cell within a group of magnetic memory cells that is selected by passing current through the associated common conductor. Writing to more than one memory cell within a group at approximately the same time can be done by activating more than one select conductive line. Referring to FIG. 8, memory cells 811, 813, 815, 821, 823, 825 are all enabled for writing when current is flowing through the common conductor 840, 850. One or more of these memory cells can be written to by applying current to one or more first select line 812, 814, 816, 822, 824, 826. In one embodiment, all memory cells of a selected common conductor are written simultaneously. Inadvertent half-select error writing due to current flowing through the common conductor alone can be avoided. That is, all enabled bits on the selected common conductor are written at essentially the same time.

Figure 11:
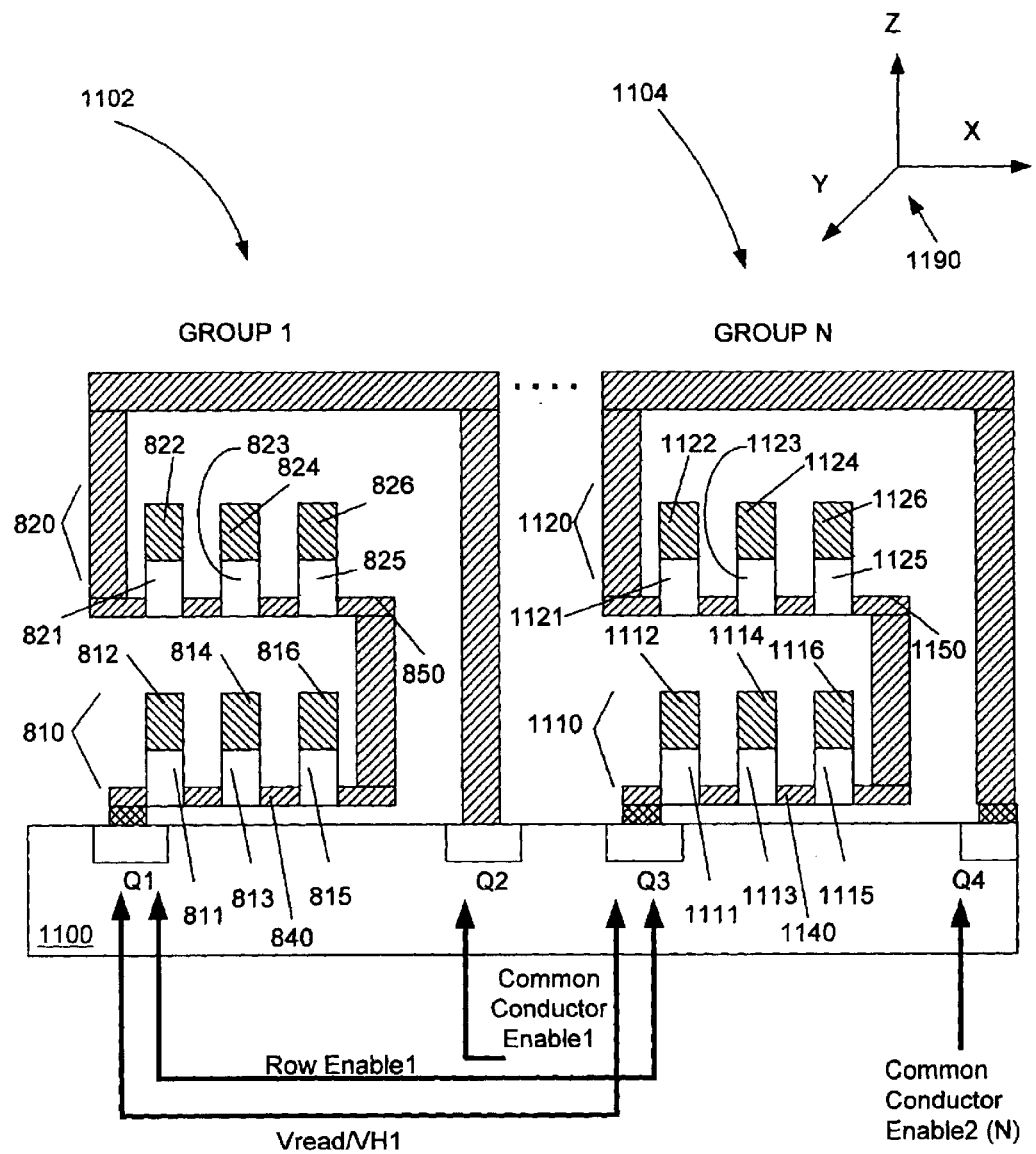
FIG. 11 shows a stacked memory structure according to another embodiment of the invention.

FIG. 11 shows a stacked memory structure according to another embodiment of the invention. This embodiment includes two separate groups of magnetic memory cells 1102, 1104. Generally, only a single one of the two groups of magnetic memory cells 1102, 1104 is selected at a time.

In FIG. 11, the first group is designated as GROUP1. The second group is designated as GROUP N, to represent that the embodiment can include a row that includes N groups of stacked magnetic memory cells. Additionally, the rows can be repeated to form an array of stacked magnetic memory cells. The array includes rows and columns of stacked magnetic memory cells. Columns of stacked memory cells are located in back and in front of the magnetic memory cells shown in FIG. 11.

The first group of magnetic memory cells 1102 includes an embodiment similar to the embodiment of FIG. 8. The embodiment of FIG. 8 has been included within FIG. 11, and the common reference designators have been included.

Rows and columns of stacked magnetic memory cells can be selected. Within a row, particular groups of stacked magnetic memory cells can be selected. For example, as shown in FIG. 11 magnetic memory cell selections can include selecting either the first group 1102 or the second group (N) 1104. The selection can be made through selection of the selection transistors Q1, Q2, Q3, Q4. The control lines of the selection transistors Q1, Q2 of the first group 1102 have been modified to Vread/VH1, Row Enable1 and Common Conductor Enable1 to allow differentiation from the control lines of the other groups of stacked magnetic memory cells as will be described in FIG. 8. The Vread/VH1 and Row Enable1 control line can be used for the second group (N) 1104 because the second group 1104 is located within the same row as the first group 1102. The second group 1104 includes a separate Common Conductor Enable2 control line. The sources, gates and drains of the control transistors Q1, Q2, Q3, Q4 are not shown in FIG. 11, but the physical characteristics of the control transistors Q1, Q2, Q3, Q4 are as described in FIG. 8.

The second group of magnetic memory cells 1104 includes a second group first layer 1110 that is formed adjacent to the substrate 1100. The second group first layer 1110 includes a third plurality of magnetic memory cells 1111, 1113, 1115. Each of the third plurality of magnetic memory cells 1111, 1113, 1115 is electrically connected to a third common conductor 1140. Each of the third plurality of magnetic memory cells is also electrically connected to corresponding third select conductive lines 1112, 1114, 1116. The third select conductive lines 1112, 1114, 1116 can be column select conductive lines.

Writing to a particular magnetic memory cell generally requires current to be conducted through a corresponding third select conductive line, and a corresponding common conductor. For example, writing to a third magnetic memory cell 1111, generally requires current to be conducted through a third select conductive line 1112 and the third common conductor 1140. The current conducted through the third select conductive line 1112 generates a magnetic field having a first orientation with respect to the magnetic memory cell, and the current conducted through the common conductor generates a magnetic field having a second orientation with respect to the magnetic memory cell. The combination of the two magnetic fields set the magnetic orientation of the magnetic memory cell.

The third common conductor 1140 provides current to sense layers of the magnetic memory cells which provides thermal heat to the third plurality of magnetic memory cells 1111, 1113, 1115. Heating the magnetic memory cells 1111, 1113, 1115 reduces the magnitude of the write current required to set magnetic orientations of the magnetic memory cells 1111, 1113, 1115. The common conductor only reduces the required write current of magnetic memory cells that are connected to the common conductor. Therefore, half-select errors of magnetic memory cells that are not connected to the common conductor can be reduced, because a smaller magnitude write current can be applied to the magnetic memory cells that are selected by the common conductor.

As shown in FIG. 11, a second group second layer 1120 of magnetic memory cells is formed over the second group first layer 1110 of magnetic memory cells. The second group second layer 1120 includes a fourth plurality of magnetic memory cell 1121, 1123, 1125.

The stacked magnetic memory structure of FIG. 11 can further include a fourth common conductor 1150 formed adjacent to the fourth plurality of magnetic memory cells 1121, 1123, 1125. The fourth common conductor 1150 causes current to flow through the corresponding magnetic memory cells which provides thermal heat to the fourth plurality of magnetic memory cells 1121, 1123, 1125. As described, heating the magnetic memory cells 1121, 1123, 1125 reduces the magnitude of the write current required to set magnetic orientations of the magnetic memory cells 1121, 1123, 1125.

The substrate 1170 can include a third select transistor Q3, and a fourth select transistor Q4. When both the third select transistor Q3 and the fourth select transistor Q4 are turned on, current is conducted through the third common conductor 1140 and the fourth common conductor 1150. Generally, the third select transistor Q3 and the fourth select transistor are both selected when writing to at least one of the magnetic memory cells 1111, 1113, 1115 of the second group first 1110, or of the magnetic memory cells 1121, 1123, 1125 of the second group second layer 1120. The third common conductor 1140 and the fourth common conductor 1150 only need to be turned on when writing to a magnetic memory cell. Reading a magnetic memory cell does not require a common conductor to be turned on.

An embodiment includes the fourth select transistor Q4 controlling enabling of the third and fourth common conductors 1140, 1150. A Common conductor Enable2 control is connected to the gate of the fourth select transistor Q4, and turns the fourth select transistor Q4 on when the common conductors 1140, 1150 are to be turned on. The source of the fourth select transistor Q4 is connected to ground, and the drain of the fourth select transistor Q4 is connected to the fourth common conductor 1150 through conductive lines.

An embodiment includes the third select transistor Q3 providing row selection and common conductor control. A Row Enable1 control is connected to the gate of the third select transistor Q3. A Vread sense or a VH (voltage for the common conductors) is connected to the drain of the third select transistor (Q3). The source of the third select transistor Q3 is connected to the third common conductor 1140. A circuit schematic will be described later to provide additional clarity of the electrical connection of the stacked magnetic memory cell structure.

Reading of at least one of the magnetic memory cells 1111, 1113, 1115 of the second group first layer 1110, or of the magnetic memory cells 1121, 1123, 1125 of the second group second layer 1120 only requires one of the transistors Q3, Q4 to be selected. The selected transistor can be used to sense a resistive state of a magnetic memory cell located between one of the conductive select lines 1112, 1114, 1116, 1122, 1124, 1126 and the selected transistor. As previously described, the resistive state of each magnetic memory cell determines the logical state of the magnetic memory cell.

This embodiment minimized half-select errors because the magnetic memory cell are divided up into groups of magnetic memory cells. Only the magnetic memory cells within a selected group are heated. As previously depicted, heating the magnetic memory cells reduces the current required to cause the magnetic memory cell to change or flip magnetic orientations. Magnetic memory cells with the selected groups are heated, and therefore, change states as a result of a lower magnitude write current. Magnetic memory cells of un-selected groups of magnetic memory cells are less likely to change states when exposed to the write current.

For example, the first group of magnetic memory cells 1102 can be selected while the second group of magnetic memory cells 1104 are not selected. Therefore, the magnetic memory cells of the first group 1102 are heated, while the magnetic memory cells of the second group 1104 are not heated.

Figure 12:
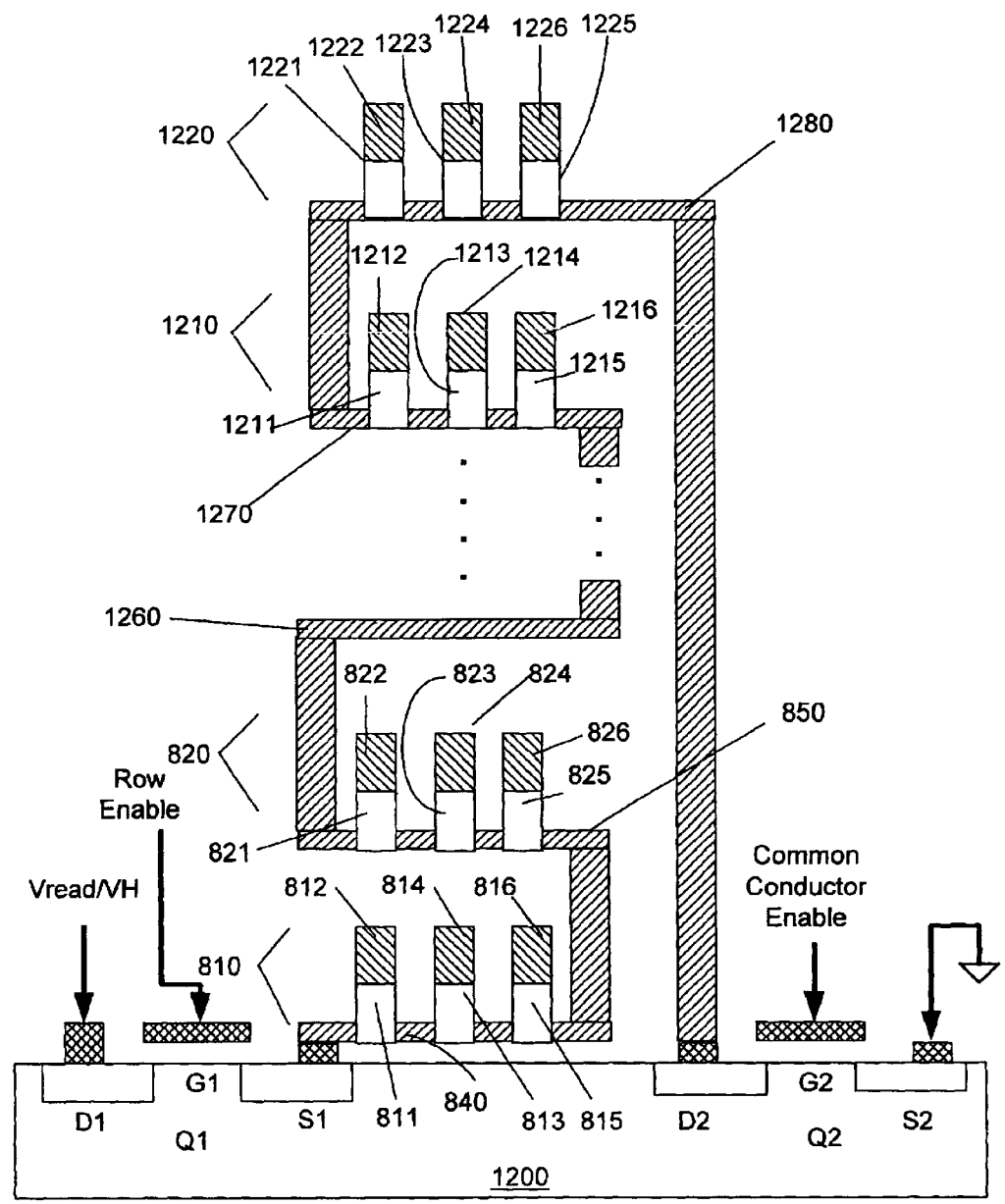
FIG. 12 shows a stacked memory structure according to another embodiment of the invention.

FIG. 12 shows a stacked memory structure according to another embodiment of the invention. This stacked memory structure includes additional layers 1210, 1220. The additional layers 1210, 1220 provide for greater density of magnetic memory cells. As shown, the stacked magnetic memory cell can include a large number of magnetic memory cell layers. In general, the layer 1220 can be an Mth layer, and the layer 1210 can be an (M−1)th layer. As shown, all of the layers of a group of magnetic memory cells are simultaneously selected.

The Mth layer 1220 of FIG. 12 includes additional magnetic memory cells 1221, 1223, 1225. The additional magnetic memory cells are electrically connected to additional conductive select lines 1222, 1224, 1226, and an additional common conductor 1280. Similar to the embodiment of FIG. 8, the additional common conductor is turned on when the first select transistor Q1 and the second select transistor Q2 are selected by the Common conductor Enable control and the Row Enable control.

The (M−1)th layer 1210 of FIG. 12 includes additional magnetic memory cells 1211, 1213, 1215. The additional magnetic memory cells are electrically connected to additional conductive select lines 1212, 1214, 1216, and an additional common conductor 1270. Similar to the embodiment of FIG. 8, the additional common conductor 1270 is turned on when the first select transistor Q1 and the second select transistor Q2 are selected by the Common conductor Enable control and the Row Enable control.

Figure 13:
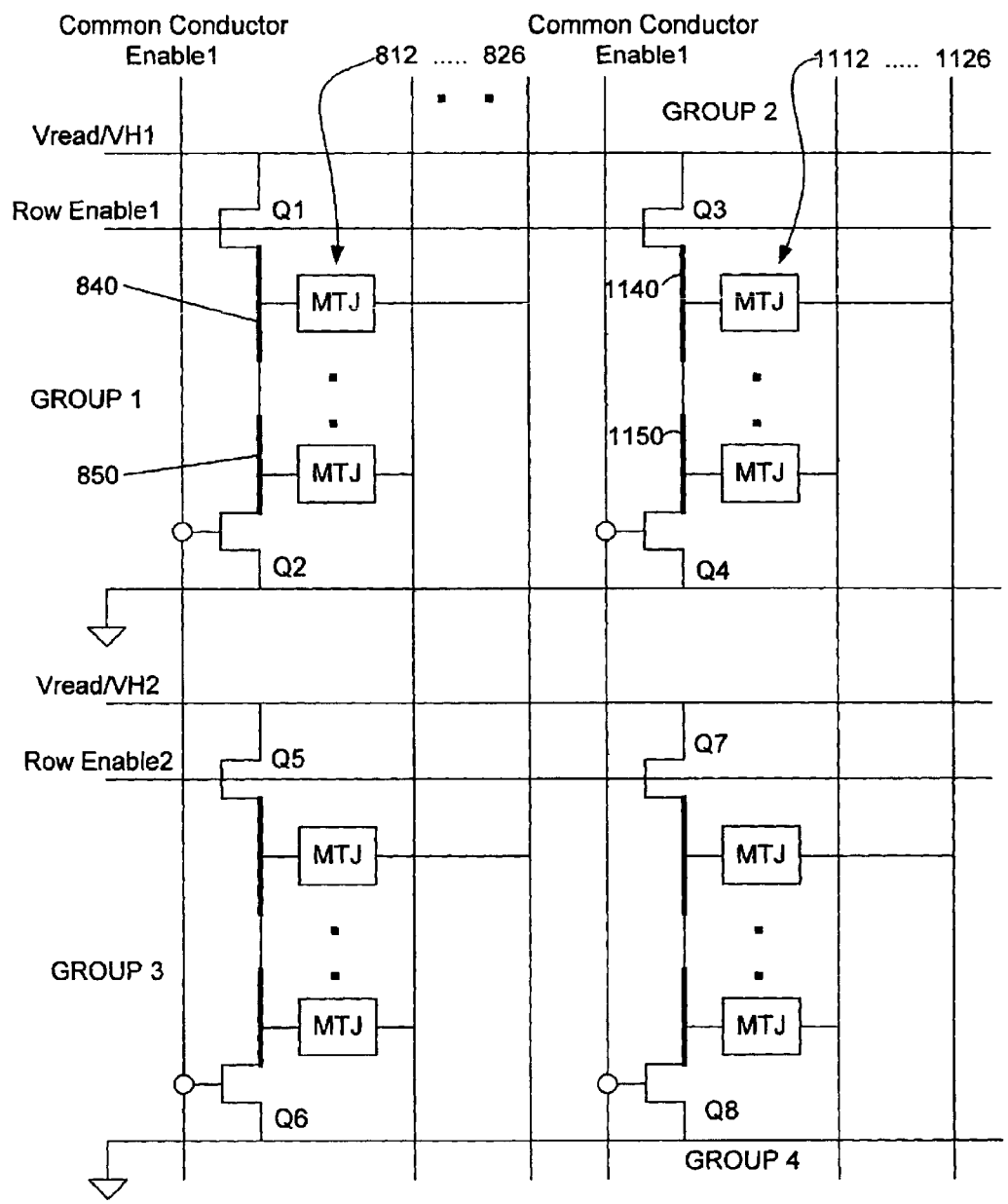
FIG. 13 is a schematic showing read/write circuitry of the magnetic memory cells according to an embodiment of the invention.

FIG. 13 is a schematic showing read/write circuitry of the magnetic memory cells according to an embodiment of the invention of FIG. 11, with the addition of a third group (GROUP 3) and a fourth group (GROUP 4). As described before, the invention can include any number of groups of magnetic memory cells.

As shown in FIG. 13 and as previously described, the first group is selected by enabling the Row Enable1, Vread/VH1 and the Common conductor Enable1 lines. The second group is selected by enabling the Row Enable1, Vread/VH1 and the Common conductor Enable2 lines. The third group is selected by enabling the Row Enable2, Vread/VH2 and the Common conductor Enable1 lines. The fourth group is selected by enabling the Row Enable2, Vread/VH2 and the Common conductor Enable2 lines.

As shown in the schematic, the first group of magnetic memory cells includes the selection transistors Q1, Q2, the common conductors 840, 850 and magnetic memory cells 811 to 825. The second group of magnetic memory cells includes the selection transistors Q3, Q4, the common conductors 1140, 1150 and magnetic memory cells 1111 to 1125. The third and fourth groups include selection transistors Q5, Q6, Q7, Q8 as shown in FIG. 11. The third and fourth groups include corresponding magnetic memory cells and common conductors.

As described earlier, the Vread/VH1 control line is connected to the drain of the first select transistor Q1. The Row Enable1 control line is connected to the gate of the first select transistor Q1. Additionally, the Vread/VH1 control line is connected to the drain of a third select transistor Q3, and the Row Enable1 control line is connected to the gate of the third select transistor Q3.

As described earlier, the Common Conductor Enable1 control line is connected to the gate of the second select transistor Q2. Additionally, the Common Conductor Enable1 control line is connected to the gate of the sixth transistor Q6.

The Vread/VH2 control line is connected to the drain of the fifth select transistor Q5. The Row Enable2 control line is connected to the gate of the fifth select transistor Q5. Additionally, the Vread/VH2 control line is connected to the drain of a seventh select transistor Q7, and the Row Enable2 control line is connected to the gate of the seventh select transistor Q7.

As described earlier, the Common Conductor Enable2 control line is connected to the gate of the fourth select transistor Q4. Additionally, the Common Conductor Enable2 control line is connected to the gate of a sixth transistor Q8.

Figure 14:
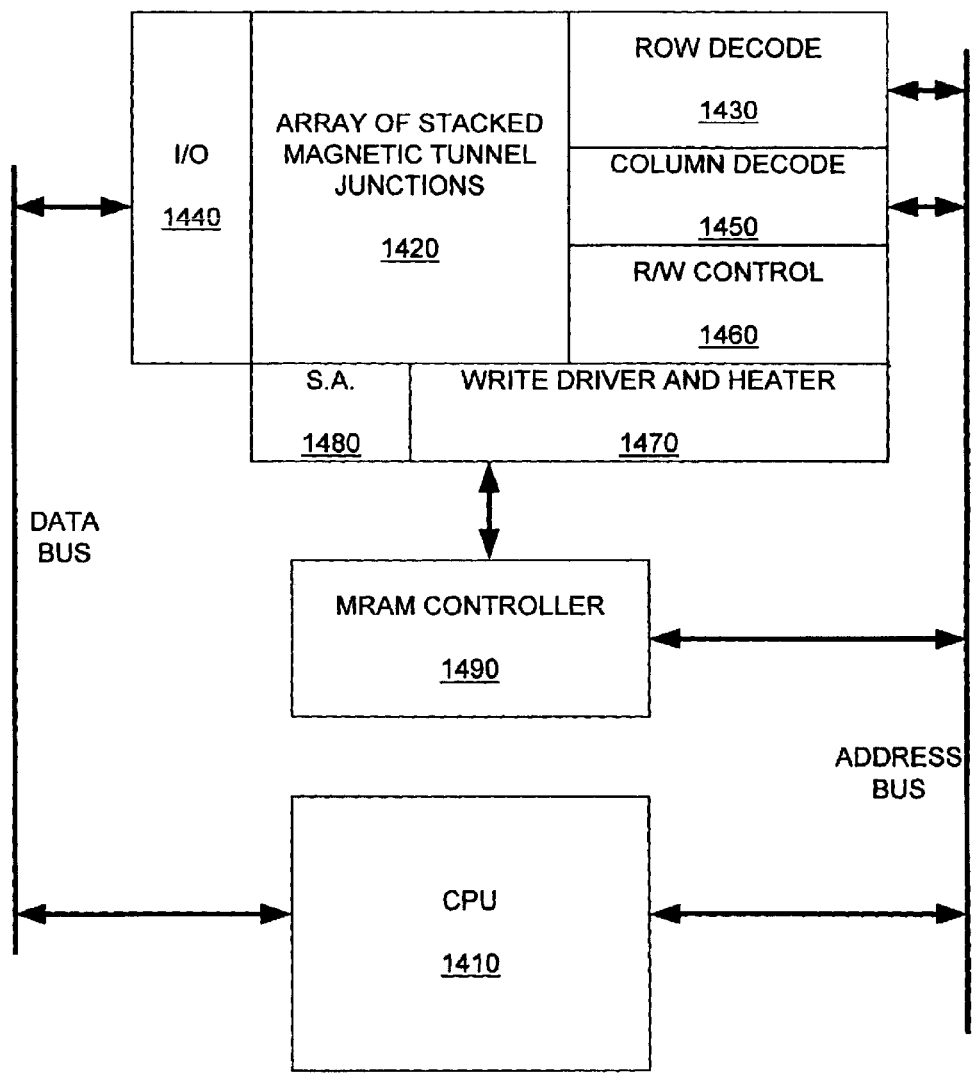
FIG. 14 is a computing system that includes magnetic memory cells according to an embodiment of the invention.

FIG. 14 is a computing system that includes magnetic memory cells according to an embodiment of the invention. The computing system includes a CPU (central processing unit) 1410 that is interfaced with an array of magnetic memory cells 1420 according to embodiments of the invention.

Support circuitry can include address and data bus lines. A row decoder 1430 selects row of the array 1420. A column decoder 1450 selects columns of the array 1420. A R/W controller provides reading and writing controls. A write drive and common conductor controller 1470 provides control over writing to the array 1420. Sense amplifiers 1480 provide for sensing states of magnetic memory cells within the array 1420. An I/O controller 1440 provide input/output controls of the array 1420. An MRAM controller 1490 can provide overall control of the array 1420.

Figure 15A:
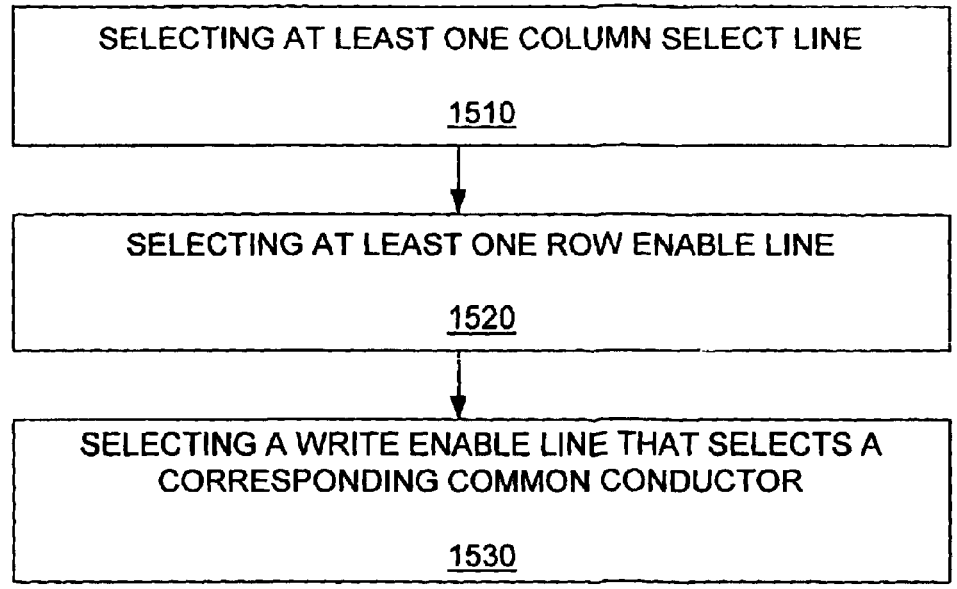
FIGS. 15A and 15B are flow charts showing a method of accessing an array of magnetic junction according to an embodiment of the invention.
Figure 15B:
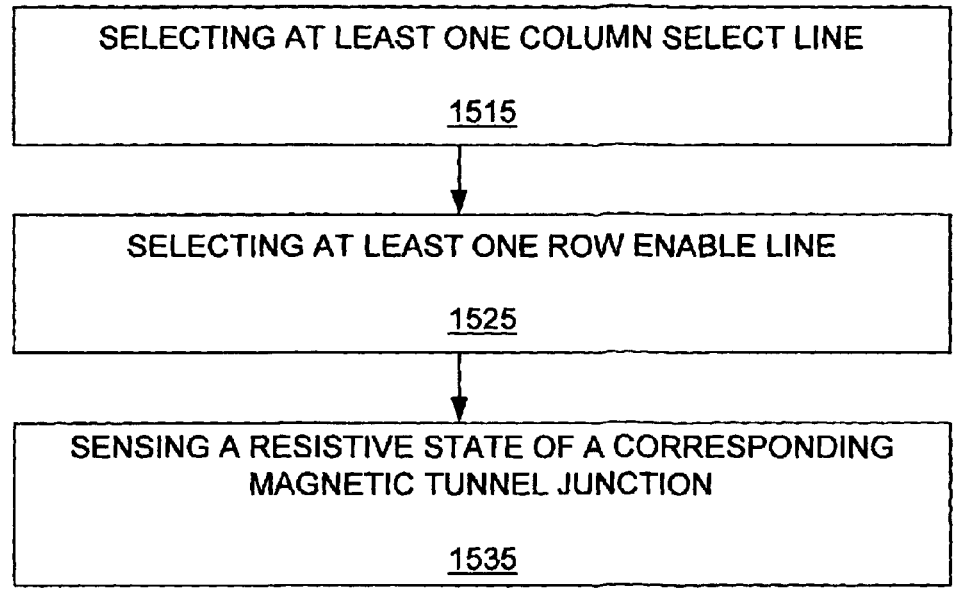

FIGS. 15A and 15B are flow charts showing a method of accessing an array of stacked magnetic junction according to an embodiment of the invention.

The flow chart of FIG. 15A shows steps of writing to a stacked magnetic memory cell memory according to an embodiment of the invention.

A first step 1510 includes selecting at least one column select line.

A second step 1520 includes selecting at least one row enable line.

A third step 1530 includes selecting a common conductor enable line that selects a corresponding common conductor.

The flow chart of FIG. 15B shows steps of reading from a stacked magnetic memory cell memory according to an embodiment of the invention.

A first step 1515 includes selecting at least one column select line.

A second step 1525 includes selecting at least one row enable line.

A third step 1535 includes sensing a resistive state of a corresponding magnetic memory cell.

Although specific embodiments of the invention have been described and illustrated, the invention is not to be limited to the specific forms or arrangements of parts so described and illustrated. The invention is limited only by the appended claims.

What is claimed is:

1. A magnetic memory cell comprising:
   a reference layer having a preset magnetization;
   a barrier layer adjacent to the reference layer;
   a sense layer having an alterable magnetization, the sense layer being adjacent to the barrier layer;
   a first conductive write line electrically connected to the reference layer;
   a second conductive write line having a gap, the gap being filled by at least a portion of the sense layer; wherein write current conducting through the second conductive write line is at least partially conducted through the portion of the sense layer, the write current increasing a temperature of the sense layer.

2. The magnetic memory cell of claim 1, wherein the sense layer further comprises:
   a ferromagnetic layer; and
   an anti-ferromagnetic layer.

3. The magnetic memory cell of claim 1, wherein the sense layer further comprises:
   a first sub-sense layer;
   a second sub-sense layer;
   a spacer layer between the first sub-sense layer and the second sub-sense layer.

4. The magnetic memory cell of claim 3, wherein the first sub-sensor layer and the second sub-sensor layer comprise a magnetic material.

5. The magnetic memory cell of claim 3, wherein the spacer layer comprises a non-magnetic material.

6. The magnetic memory cell of claim 1, wherein write current conducting through the sense layer increases a temperature of the sense layer, and a magnetic coercivity of the sense layer decreases as a temperature of the sense layer increases.

7. A group of magnetic memory cells, wherein the group comprises a plurality of magnetic memory cells of claim 1, forming a layer over a substrate.

8. The group of magnetic memory cells of claim 7, wherein a common second conductive write line conducts write current through portions of the sense layers of each of the magnetic memory cells of the group.

9. A magnetic memory structure comprising:
   a first group of magnetic memory cells of claim 1, the first group comprising:
   a first group first layer formed adjacent to a substrate, the first layer comprising a first plurality of magnetic memory cells;
   a first group second layer formed adjacent to the first layer, the second layer comprising a second plurality of magnetic memory cells; and
   a common first group conductor connected to each of the first plurality of magnetic memory cells and the second plurality of magnetic memory cells.

10. The magnetic memory structure of claim 9, wherein current flowing through the first common conductor regions thermally heats at least one of the first plurality of magnetic memory cells and the second plurality of magnetic memory cells when at least one of the first plurality of magnetic memory cells and the second plurality of magnetic memory cells is selected.

11. The magnetic memory structure of claim 9, further comprising:
    a second group of magnetic memory cells, the second group comprising:
    a second group first layer formed adjacent to the substrate, the second group first comprising a third plurality of magnetic memory cells;
    a second group second layer formed adjacent to the second group first layer, the second group second layer comprising a fourth plurality of magnetic memory cells;
    a common second group conductor connected to each of the third plurality of magnetic memory cells and the fourth plurality of magnetic memory cells.

12. The magnetic memory structure of claim 9, wherein current flowing through the first common conductor regions thermally heat at least one of the first plurality of magnetic memory cells and the second plurality of magnetic memory cells when at least one of the first plurality of magnetic memory cells and the second plurality of magnetic memory cells is selected.

13. The magnetic memory structure of claim 9, wherein active devices that control selection of the magnetic memory cell are formed in the substrate.

14. The magnetic memory structure of claim 9, wherein active devices that control sensing of magnetic states of the magnetic memory cell are formed in the substrate.

15. The magnetic memory structure of claim 9, wherein less write current is required to write to a selected group of magnetic memory cells.

16. The magnetic memory structure of claim 9, wherein less write current is required to write to the first, second, third and fourth plurality of magnetic memory cells if corresponding common conductor regions are selected.

17. The magnetic memory structure of claim 9, further comprising first select lines, second select lines and third select lines, the first select lines selecting individual magnetic memory cells of the first group, the second select lines and third select line selecting the first and second pluralities of magnetic memory cells.

18. The magnetic memory structure of claim 17, wherein a first select line, a second select line and a third select line must be selected to write to a magnetic memory cell.

19. The magnetic memory structure of claim 17, wherein only a first select line and a second select line must be selected to read from a magnetic memory cell.

20. The magnetic memory structure of claim 17, wherein the first select lines are column select lines, the second select lines are row enable lines and the third select lines are write enable lines.

21. A magnetic memory cell comprising:
    a reference layer having a preset magnetization;
    a barrier layer adjacent to the reference layer;
    a sense layer having an alterable magnetization, the sense layer being adjacent to the barrier layer;
    a first conductive write line electrically connected to the reference layer;
    a second conductive write line having a gap, the gap being filled by at least a portion of the reference layer; wherein write current conducting through the second conductive write line is at least partially conducted through the portion of the reference layer, the write current increasing a temperature of at least one of the reference layer and the sense layer.

22. A computing system comprising:

a central processing unit;

a memory array electronically connected to the central processing unit;

the memory array comprising a magnetic memory structure;

a first group of memory cells, the first group of memory cells comprising;

the magnetic memory structure comprising:

a reference layer having a preset magnetization;

a barrier layer adjacent to the reference layer;

a sense layer having an alterable magnetization, the sense layer being adjacent to the barrier layer;

a first conductive write line electrically connected to the reference layer;

a second conductive write line having a gap, the gap being filled by at least a portion of the sense layer; wherein write current conducting through the second conductive write line is at least partially conducted through the portion of the sense layer, the write current increasing a temperature of the sense layer.

23. The computing system of claim 22, further comprising:

a second group of magnetic memory cells, the second group comprising:

a second group first formed adjacent to the substrate, the second group first comprising a third plurality of magnetic memory cells;

a second group second layer formed adjacent to the second group first, the second group second layer comprising a fourth plurality of magnetic memory cell;

a third common conductor formed adjacent to at least one of the third plurality of magnetic memory cells and the fourth plurality of magnetic memory cells, the third common conductor causing current to be conducted through a sense layer of the magnetic memory cells providing thermal heat to at least one of the third plurality of magnetic memory cells and the fourth plurality of magnetic memory cells;

wherein only one of the first group and second group can be selected at a time.

24. A method of writing to a magnetic memory structure, the magnetic memory structure comprising a first layer formed adjacent to a substrate, the first layer comprising a first plurality of magnetic memory cells, a second layer formed adjacent to the first layer, the second layer comprising a second plurality of magnetic memory cell, a first common conductor connected to sense layers of at least one of the first plurality of magnetic memory cells and the second plurality of magnetic memory cells, the first common conductor conducting current through sense layers of the magnetic memory cells providing thermal heat to at least one of the first plurality of magnetic memory cells and the second plurality of magnetic memory cells, the method comprising:

selecting at least one column select line;

selecting at least one row enable line;

selecting a write enable line that turns on a corresponding common conductor; and writing to a magnetic memory cells electrically coupled to the common conductor.

25. The method of claim 24, wherein the common conductor is connected to a plurality of magnetic memory cells, and the plurality of magnetic memory cells are simultaneously written to when the common conductor is conducting current.

* * * * *